(12) United States Patent
Timmerman et al.

(10) Patent No.: US 9,611,414 B2
(45) Date of Patent: Apr. 4, 2017

(54) THERMAL INTERFACE MATERIAL WITH MIXED ASPECT RATIO PARTICLE DISPERSIONS

(71) Applicant: HENKEL IP & HOLDING GMBH, Duesseldorf (DE)

(72) Inventors: John Timmerman, Minneapolis, MN (US); Sanjay Misra, Shoreview, MN (US)

(73) Assignee: HENKEL IP & HOLDING GMBH, Duesseldorf (DE)

( * ) Notice: Subject to any disclaimer, the term of this patent is extended or adjusted under 35 U.S.C. 154(b) by 0 days.

(21) Appl. No.: 14/328,834

(22) Filed: Jul. 11, 2014

(65) Prior Publication Data
US 2016/0009975 A1    Jan. 14, 2016

(51) Int. Cl.
| | | |
|---|---|---|
| C09K 5/14 | (2006.01) | |
| H05K 7/20 | (2006.01) | |
| H01L 23/34 | (2006.01) | |
| C08K 7/04 | (2006.01) | |
| C08K 3/38 | (2006.01) | |
| C08K 3/22 | (2006.01) | |
| C08K 3/04 | (2006.01) | |
| C08K 7/18 | (2006.01) | |

(52) U.S. Cl.
CPC ............. *C09K 5/14* (2013.01); *H01L 23/34* (2013.01); *H05K 7/2039* (2013.01); *C08K 3/04* (2013.01); *C08K 7/04* (2013.01); *C08K 7/18* (2013.01); *C08K 2003/2227* (2013.01); *C08K 2003/382* (2013.01); *C08K 2201/016* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 4,908,197 A | | 3/1990 | Bolt et al. |
| 4,970,098 A | | 11/1990 | Ayala-Esquilin et al. |
| 6,114,429 A | | 9/2000 | Yamada et al. |
| 6,251,978 B1 * | | 6/2001 | McCullough ........ C08K 3/0033 252/511 |
| 2003/0059703 A1 | | 3/2003 | Pickering |
| 2003/0201427 A1 | | 10/2003 | Hori et al. |
| 2003/0220432 A1 * | | 11/2003 | Miller ....................... C08K 3/04 524/439 |
| 2004/0125565 A1 | | 7/2004 | Chen |
| 2005/0101719 A1 * | | 5/2005 | Ishihara ............... C08K 3/0033 524/495 |
| 2007/0110994 A1 | | 5/2007 | Pickering |
| 2010/0196698 A1 | | 8/2010 | Trummer et al. |
| 2011/0127461 A1 * | | 6/2011 | Fukuoka ................. C08L 83/06 252/74 |
| 2012/0129990 A1 * | | 5/2012 | Kikuchi .................. C08L 69/00 524/143 |
| 2012/0133072 A1 * | | 5/2012 | Bunyan ................... C08L 83/04 264/104 |
| 2012/0164570 A1 | | 6/2012 | Pickering et al. |
| 2013/0207029 A1 | | 8/2013 | Janssen et al. |

FOREIGN PATENT DOCUMENTS

| | | |
|---|---|---|
| EP | 0750008 | 12/1996 |
| WO | 2011019719 | 2/2011 |
| WO | 2012152262 | 11/2012 |

OTHER PUBLICATIONS

Written Opinion in related PCT Patent Application Serial No. PCT/US2015/037336 dated Oct. 22, 2015.
Bigg, et al., "Thermally Conductive Polymer Compositions", Polym. Cormpos., vol. 7, No. 3, pp. 125-140; Jun. 1986 (abstract only).
Inoue, et al., "Anisotropic Thermal Conductivity in Electrically Conductive Adhesives with Single and Bimodal Filler-Size Distributions Containing Ag Flakes and Micro-Particles", 3rd Electronic System-Integration Technology Conference (ESTC 2010). (abstract only).
Iqbal et al., "Thermal Conductivity of Polyurethane Composites Containing Nanometer- and Micrometer-Sized Silver particles: Current Topics of CTAS2011", Journal of Thermal Analysis and Calorimetry 108.3 (2012): 933-938. (abstract only).
Nabiollahi et al., "FEM Simulation of Bimodal and Trimodal Thermally Conductive Adhesives", 9th IEEE Conference on Nanotechnology (IEEE-NANO 2009). (abstract only).
Nakai et al., "Terham Conductivity of Ag-Filled Epoxy Adhesive as a Function of Ag Concentration", High Temperatures—High Pressures 27-28.6 (1995): 665-72. (abstract only).

* cited by examiner

*Primary Examiner* — Tanisha Diggs
(74) *Attorney, Agent, or Firm* — James E. Cummings

(57) ABSTRACT

An electron package includes an interface member between an electronic component and a thermal dissipation member. The interface member is highly efficient in transmitting thermal energy and/or suppressing electromagnetic radiation, with a particle filler dispersion including a combination of substantially spherical particles and substantially platelet-shaped particles within dispersion attribute ranges.

13 Claims, 10 Drawing Sheets

THERMAL INTERFACE MATERIAL WITH MIXED ASPECT RATIO PARTICLE DISPERSIONS

FIELD OF THE INVENTION

The present invention relates to thermal interface materials generally, and more particularly to conductive interface products for use in connection with heat-generating electrical devices and heat sinking structures, wherein the interface products additionally act to suppress the propagation of electromagnetic radiation therethrough. The present invention further relates to interface materials that derive enhanced functional properties through the use of mixed aspect ratio particle dispersions.

BACKGROUND OF THE INVENTION

Thermally conductive interface materials are widely utilized in the electronics industry for operably coupling heat-generating electronic components to heat-sinking structures. Most typically, such thermally conductive interface materials are utilized in connection with heat-generating electronic components such as integrated circuits (IC), central processing units (CPU), and other electronic components containing relatively high-densities of conductive traces and resistor elements. In particular, the thermal interface materials are oftentimes utilized to operably couple such heat-generating electronic devices to heat-sinking structures, such as finned heat sink structures. In such a manner, excess thermal energy generated by the electronic components may be expelled to the heat sinking structures via the thermal interface material.

Certain electronic devices, in addition to generating excess thermal energy, create electromagnetic radiation across various frequencies. Such radiation can have the effect of causing electromagnetic interference (EMI) upon other electronic devices susceptible to and/or tuned to received electromagnetic wave forms. Devices sensitive to electromagnetic interference include, for example, cellular phones, portable radios, laptop computers, and the like.

As the prevalence of portable electronic devices which are sensitive to electromagnetic interference increases, manufacturers of internal electronic componentry for such devices have incorporated electromagnetic radiation-absorbing substances into thermally conductive interface materials disposed adjacent to the electromagnetic radiation-producing devices. Constructions have therefore been implemented in thermal interface materials which bear an operating characteristic of absorbing, reflecting, or otherwise suppressing the transmittance of electromagnetic radiation through the interface. As a result, such thermal interface material constructions act to provide a thermal release pathway while simultaneously suppressing transmittance of electromagnetic radiation from the corresponding electronic component to which the thermal interface material is addressed.

The thermal interface material constructions proposed to date for providing such characteristics, however, utilize homogenous or quasi-homogenous dispersions of thermally conductive and radiation suppression particles within the thermal interface material backbone matrix. The resultant compositions, particularly at low total filler loading volume fractions (e.g. ≤50 vol. %), have limited thermal conductivity and electromagnetic interference suppression capabilities. At such total filler loading volume fractions, which are often necessary to achieve the desired mechanical properties, it is difficult to simultaneously achieve high thermal conductivity and electromagnetic radiation suppression. As electronic components increase in power, as well as in packing densities, the need arises to enhance thermal transfer and electromagnetic suppression capabilities in thermal interface materials.

It is therefore an object of the present invention to provide an interface product with superior thermal conductivity and electromagnetic interference suppression properties over that which is conventionally available.

SUMMARY OF THE INVENTION

By means of the present invention, thermal conductivity and/or electromagnetic suppression of conformable interface materials may be improved in comparison to conventional interface materials incorporating equivalent particulate filler loading volume fractions. As a result, the interface materials of the present invention remain suitably conformable to minimize thermal energy transmission impedance at the interfaces with the electronic component and/or the heat dissipation member.

In one embodiment, a thermal interface material of the present invention is positionable in proximity to a heat source for thermal dissipation from the heat source and for shielding of electromagnetic interference. The thermal interface material includes a polymer matrix and thermally conductive particulate filler dispersed in the polymer matrix at 30-50% by volume. The particulate filler includes substantially spherical particles having an aspect ratio of between 0.8-1.2, and a spherical particle volume. The particulate filler further includes platelet particles having a length, a width, and a thickness, and a platelet particle volume. The length and the width of the platelet particles are each substantially greater than the thickness of the platelet particles, such that the platelet particles have an aspect ratio of at least 10. A volumetric loading ratio of the platelet particles to the spherical particles is between 0.1:1 and 1:1. A particle diameter ratio of the platelet particle diameter to the spherical particle diameter is between 1:1 and 20:1. The thermal interface material exhibits a thermal conductivity of at least 0.5 W/m*K.

In some embodiments, an electronic package may be provided with an electronic component and a heat dissipation member, wherein the thermal interface material is disposed between and in contact with the electronic component and the heat dissipation member.

DETAILED DESCRIPTION OF THE PREFERRED EMBODIMENTS

The objects and advantages enumerated above together with other objects, features, and advances represented by the present invention will now be presented in terms of detailed embodiments described with reference to the attached drawing figures. Other embodiments and aspects of the invention are recognized as being within the grasp of those having ordinary skill in the art.

For the purposes hereof, the terms "electromagnetic radiation", "electromagnetic interference", and "EMI" are intended to mean radiation that is capable of interfering with the normal operation of electronic components, such as processors, transmitters, receivers, and the like. Such radiation may typically be in the range of 1-10 GHz. The terms listed above, as well as other similar terms, are intended to refer to radiation in this frequency range, and may therefore be used interchangeably to define the radiation transmission affected (absorbed, reflected, contained, etc.) by the materials of the present invention.

Figure 1:
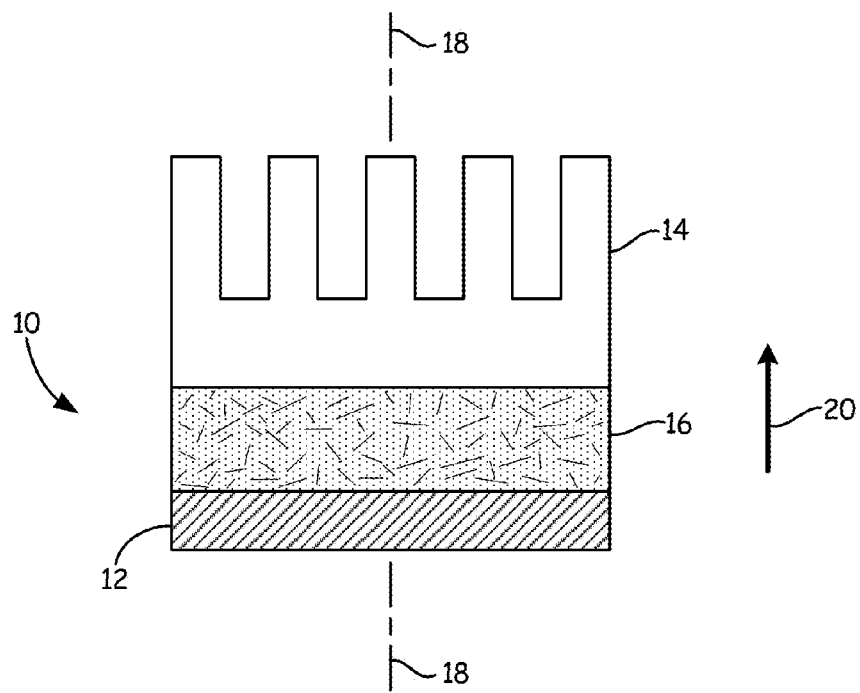
FIG. 1 is a schematic illustration of an electronic package of the present invention.
Figure 2:
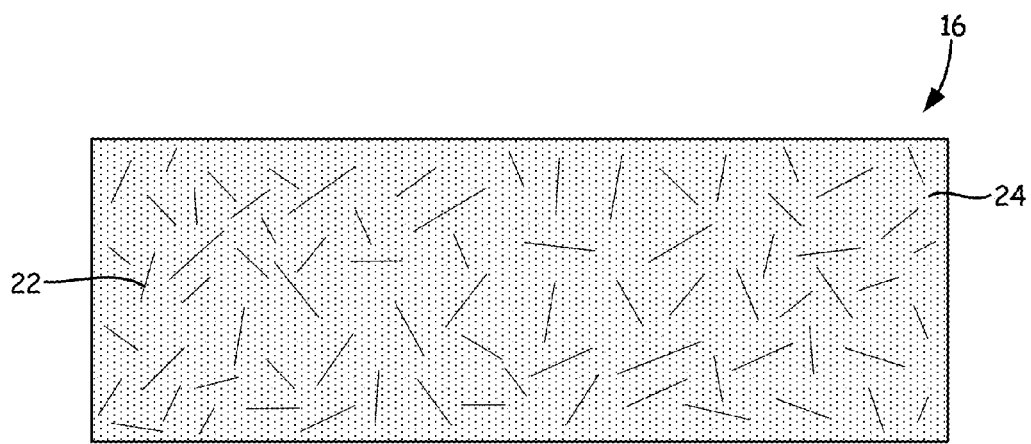
FIG. 2 is an isolation view of an interface portion of the electronic package illustrated in FIG. 1.

With reference now to the drawing figures, and first to FIG. 1, an electronic package 10 includes an electronic component 12, a heat dissipation member 14, and a thermal interface 16 disposed between and in contact with electronic component 12 and heat dissipation member 14. In other embodiments, interface 16 may be out of physical contact with one or both of electronic component 12 and heat dissipation member 14, but is nevertheless along a thermal dissipation pathway from electronic component 12 to heat dissipation member 14. Interface 16 is preferably adapted to efficiently conduct thermal energy, and to suppress transmission of electromagnetic radiation. Suppression of EMI may be achieved through a combination of absorption and reflection of the electromagnetic radiation. Interface 16 may be disposed between electronic component 12 and heat dissipation member 14 along an axis 18, which defines a dissipation direction 20 from the heat source (electronic component 12) to the heat dissipation member 14.

Interface 16 is preferably in the form of particulate filler 22 dispersed in a thermoplastic or thermosetting polymer matrix 24. Particulate filler 22 includes one or more thermally conductive and EMI suppressive materials dispersed in polymer matrix 24 to an extent sufficient to provide a desired thermal conductivity and EMI suppression properties. Particulate filler 22 may comprise one or more materials, but is heterogeneous in its morphology. In particular, it has been discovered that a heterogeneous particulate filler morphology made up of the combination of spherical and platelet-like particles yields a non-additive improvement in thermal conductivity and/or EMI shielding over an equivalent loading volume fraction of either particulate filler shape when used alone. In most embodiments, therefore, particulate filler 22 may include two or more distinct particulate materials, forming a heterogeneous filler morphology. A wide variety of materials may be useful in making up particulate filler 22, so long as the heterogeneous filler morphology of the present invention is achieved. For the purposes hereof, the term "morphology" refers to the shapes of the particles making up particulate filler 22, wherein a "heterogeneous morphology" refers to particles having different physical shapes, and a "homogeneous morphology" refers to particles with substantially similar physical shapes. With respect to the present invention, a heterogeneous morphology including spherically-shaped particles and platelet-shaped particles is contemplated. Example materials useful in absorbing electromagnetic radiation over a wide frequency range include magnetic metal powders, such as nickel or nickel alloys and iron or iron alloys. Other magnetic metals, magnetic metal oxide ceramics and ferrites, graphite/carbon powders, metal alloy, and non-metallic fillers may also be useful as electromagnetic interference suppression materials. Specific illustrative examples of EMI suppression materials include Nn—Zn, Ni—Zn, Fe—Ni, Fe—Si, Fe—Al, Fe—Co, alloys of iron and conductive metallic and non-metallic particles such as silver, copper, carbon, and graphite, as well as boron nitride, polyacrylonitrile, graphite, and magnetic ceramics. The above materials are exemplary only, and are not intended to be limiting to the use of the various EMI suppression materials known in the art.

In addition to the EMI suppression property, particulate filler 22 includes thermally conductive filler material which aids in the transfer of thermal energy through interface 16. Thermally conductive particulate fillers are well known in the art, and include, for example, alumina, aluminum nitride, aluminum hydroxide, boron nitride, zinc nitride, and silicon carbide. Other thermally conductive particulate filler materials are contemplated by the present invention as being useful in particulate filler 22, and may be dispersed in polymer matrix 24 at a concentration sufficient to provide interface 16 with a thermal conductivity along dissipation direction 20 of at least 0.5 W/m*K.

In working to achieve higher thermal conductivity and/or electromagnetic shielding performance over conventional compositions, applicant has surprisingly discovered that a specific heterogeneous particulate filler morphology of a combination of spherical and platelet-shaped particles dispersed in a polymer matrix exhibits a non-additive performance enhancement in which a given loading concentration of the heterogeneous particulate filler exhibits substantially better thermal conductivity and/or electromagnetic shielding than an equivalent loading volume fraction of a homogeneous particulate filler morphology of either the spherical or platelet particles alone in the polymer matrix. Such effect, however, is surprisingly observed only within a specific framework of combination attributes, including total filler loading concentration, particle aspect ratios, relative loading ratios among the spherical and platelet particles, and relative particle size ratios among the spherical and platelet particles. In particular, it was discovered that only the combination of specific quantity ranges of such attributes results in the observed beneficial performance enhancement, and only if each of such quantity ranges of each attribute were present in the combination. Accordingly, the surprising discovery of the present invention is derived from a combination of specific attributes operating in concert. Known compositions, by contrast, account for only some of the key attributes of the present invention, and therefore do not realize the unexpected results of the present combination.

Particulate filler 22 of the present invention includes a combination of substantially spherical particles 32 and substantially platelet-shaped particles 34. For the purposes hereof, a spherical particle is considered to have an aspect ratio of between 0.8-1.2, wherein the aspect ratio of a particle is determined as follows:

$$A = D_{major}/D_{minor}$$

Figure 3:
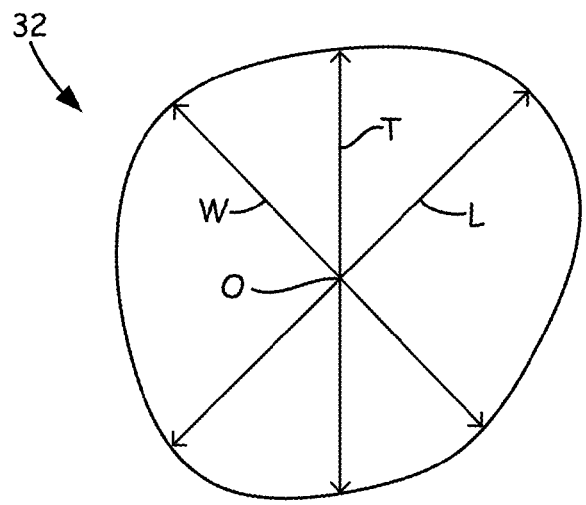
FIG. 3 is an illustration of a substantially spherical particle.

Wherein,

A=aspect ratio $D_{major}$=the longest dimension taken along the length or width axis of the particle $D_{minor}$=the dimension taken along the thickness axis of the particle An example substantially spherical particle 32 is illustrated in FIG. 3, wherein length axis "L", width axis "W", and thickness axis "T" meet orthogonally at a central origin "O" of particle 32. The aspect ratio "A" of substantially spherical particle 32 is therefore defined as the greater through dimension along length or width axes "L" or "W" divided by the through dimension along thickness axis "T". In the case of a perfect sphere, therefore, the through-dimensions are diameter dimensions taken along the respective axes, which would result in an aspect ratio "A" of 1.0.

Figure 4:
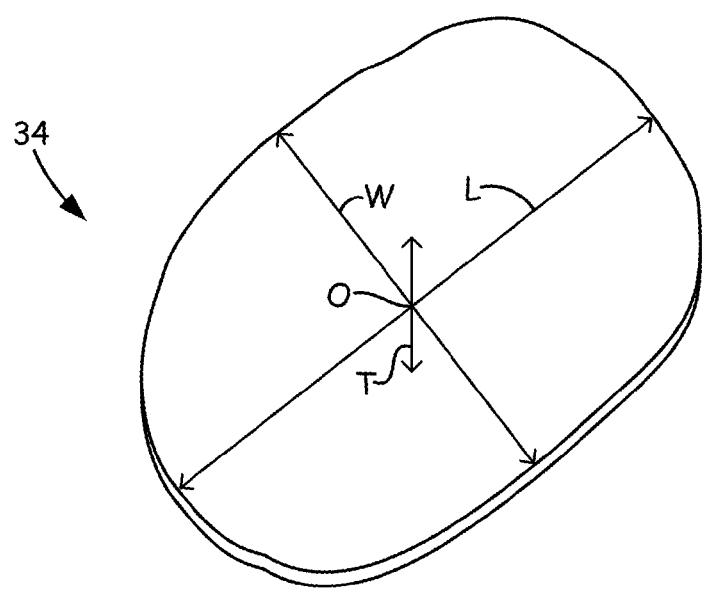
FIG. 4 is an illustration of a substantially platelet-shaped particle.

A substantially platelet-shaped particle 34 is illustrated in FIG. 4 with respective length, width, and thickness axes. For the purposes hereof, a platelet particle is considered to have similar dimensions along its length and width axes "L", "W", but with a substantially smaller dimension along its thickness axis "T", so as to yield an aspect ratio greater than 10. In some embodiments, the platelet particles 34 exhibit an aspect ratio of at least 100.

The spherical and platelet particle sizes, and, importantly, their relative sizes in the dispersions of the present invention have been discovered to be an important aspect in achieving the observed thermal conductivity and EMI suppression properties. Therefore, the respective particle sizes may be expressed using the concept of "equivalent spheres". In this case, the particle size is defined by the diameter of an equivalent sphere having the same property as the actual particle, such as volume. For the purposes of this application, the particle diameter is considered to be the median volume equivalent sphere diameter as measured using laser diffraction instrumentation and Mie theory to interpret the results. It is also to be understood that the spherical particles 32 and the platelet particles 34 may not be monodisperse, but may instead exhibit a particle size distribution of substantially spherically-shaped and substantially platelet-shaped particles of different sizes. Such a distribution may be expressed in volume weighted distributions, wherein the contribution of each particle in the distribution relates to the volume of that particle. For volume weighted particle size distributions, such as those measured by laser diffraction, it is convenient to report parameters based upon the maximum particle size for a given percentage volume of the sample. Percentiles may be defined as:

$$D_a b$$

Wherein,

D=diameter a=distribution weighting (v for volume)

b=percentage of sample below this particle size

For example, the value $D_v 50$ is the maximum particle diameter below which fifty percent of the sample volume exists; also known as the median particle size (diameter) by volume. Typical particle size distributions of the present invention include a $D_v 10$ value of about 40-100% of the median diameter, and a $D_v 90$ value that is about 100-160% of the median diameter. Particle size distributions measured by laser diffraction may be confirmed through direct electron microscopy examination.

Applicant has determined that particulate filler 22 is preferably dispersed in polymer matrix 24 at a loading concentration of 30-50% by volume, and more preferably at a loading concentration of 40-50% by volume. As indicated above, it is desirable that interface 16 maintain a "conformable" characteristic with a relatively low bulk compressive modulus. Loading concentrations of particulate filler 22 in excess of 50% by volume may undesirably raise the bulk compressive modulus of interface 16. The present discovery of enhanced thermal conductivity and electromagnetic radiation attenuation per unit volume of particulate filler therefore permits dispersions with relatively low total loading concentrations of particulate filler 22 to maintain low bulk compressive modulus values for interface 16, while retaining high thermal conductivity and/or EMI attenuation values.

Within the total loading concentration of particulate filler 22 described above, applicant has found that a loading ratio among platelet particles 34 and spherical particles 32 achieves the observed functional benefits. For the purposes hereof, the term "volumetric loading ratio" refers to the concentration ratio, by volume, of platelet particles 34 to spherical particles 32. A volumetric loading ratio of platelet particles 34 to spherical particles 32 of between 0.1:1 and 1:1 are preferred in the dispersions of the present invention.

It has further been determined that an element in the preparation of the dispersions of the present invention is a particle diameter ratio between platelet particles 34 and spherical particles 32. The "particle diameter ratio" compares the median particle diameters of the platelet and spherical particles of the dispersion, with the median particle diameters being defined hereinabove. It has been discovered that a particle diameter ratio of the median platelet particle diameter to the median spherical particle diameter is between 1:1 and 20:1. The surprising functional benefit of the present invention is substantially eliminated at particle diameter ratios outside of this range.

Preferably, polymer matrix 24 provides an overall soft and flexible characteristic to interface 16. Specifically, interface 16 preferably exhibits an overall compressive modulus of less than about 5 MPa, and more preferably a bulk compressive modulus of less than 1 MPa, as well as a bulk hardness of between about 10 Shore 00 and 50 Shore A, and more preferably a bulk hardness of between 10 Shore 00 and 70 Shore 00, all at a room temperature of 20° C. In particular embodiments, interface 16 may exhibit a hardness of between 15 Shore 00 and 30 Shore 00 at 20° C. Such flexibility and softness enables the application of interface 16 to uneven surfaces of electronic component 12 and heat dissipation member 14 without the formation of gaps. The conformability aspect of interface 16, brought about by its low modulus and hardness values, is important in ensuring a continuous contact area between the thermally conductive interface 16 and the associated components of package 10, so as to maximize heat transfer efficiency, as well as to minimize the risk of damage to electronic component 12 in the assembly of electronic package 10.

The bulk compressive modulus and bulk hardness properties of interface 16, which are derived from polymer matrix 24, are such so as to permit handlability of interface 16. In other words, it is desired that interface 16 have a softness that is within a workable range that provides both the compliance and flexibility benefits described above, as well as sufficient hardness to be relatively dimensionally stable in handling and assembly. The hardness ranges described above, including between 10-70 Shore 00, have been found by the applicant to strike a useful balance in radiation shielding and thermal transfer in combination with its ease of handling, including by automated equipment. In some embodiments, interface 16 may be a self-supporting body that is relatively dimensionally stable at room temperature, or may be less viscous, including liquidly dispensable for form-in-place applications. The hardness and modulus ranges described above are intended to apply to the present interface 16 as installed at room temperature. Under operating conditions, with elevated temperatures, the hardness values of the present interface 16 may be reduced, particularly in the event that phase-changing materials are employed in the polymeric matrices 24 of the present interface 16.

Polymer matrix 24 may be formed from a thermoplastic or thermosetting polymer. Examples of thermoplastic and thermosetting resins useful in polymer matrix 24 include, for example, silicone, acrylic, urethane, epoxy, polysulfide, polyisobutylene, and polyvinyl or polyolefin based polymers. Polymeric matrices developed from such thermoplastic or thermosetting resins provide a relatively soft and flexible substrate in which particulate filler 22 may be dispersed at a concentration of between about 30-50% by volume.

In addition to the thermal conductivity property described above, interface 16 may further provide electromagnetic radiation suppression. Accordingly, electromagnetic radiation emanating from, for example, electrical component 32 may be, to a significant extent, absorbed or reflected by interface 16 so as to not transmit through thickness "T". Preferably, at least about 10% of electromagnetic radiation is either absorbed or reflected back toward a source at, for example, electronic component 12. In some embodiments, less than about 90% of electromagnetic radiation is allowed to transmit through interface 16 of the present invention. An electromagnetic radiation absorption of at least 1 dB/in, and more preferably at least 10 dB/in at 2.4 GHz may be achieved by interface 16 of the present invention. This measure of electromagnetic absorption effectiveness may be measured by the following relationship:

$$A = 10*\mathrm{LOG}(10^{\frac{S_{11}}{10}} + 10^{\frac{S_{21}}{10}}) \div T$$

Wherein,
A=electromagnetic absorption (dB/in)
S11=electromagnetic reflection coefficient
S21=electromagnetic transmission coefficient
T=thickness of interface pad (in.)

EXAMPLES

Sets of thermal interface pads were prepared to test thermal conductivity and electromagnetic radiation absorption with various total particulate filler loading concentrations, volumetric loading ratios between platelet particles and spherical particles, and particle diameter ratios between platelet particles and spherical particles. The interface pads were prepared to a thickness of about 1 mm for testing.

Example 1

A first set of interface pad samples was prepared with substantially spherical alumina particles available from Denka, and boron nitride (BN) platelet particles available from Momentive. A blend of a vinyl functional silicone and a hydride functional silicone with a platinum catalyst and a maleate inhibitor was prepared as the base resin for the polymer matrix of the interface pad. Mixing of the resin materials, along with the alumina and boron nitride filler particles was performed using 100 g batches in a FlackTek speed mixer for thirty seconds at 2200 rpm. Following mixing, the material was allowed to cool to 25° C., and then mixed for another fifteen seconds at 2200 rpm.

Example 2

Another set of interface pads was prepared using substantially spherical alumina particles available from Denka and platelet-shaped graphene particles available from Cabot. The polymer matrix was prepared from a commercially available RTV two-part condensation-cure molding silicone. The silicone A side was mixed with the graphene and alumina particles for thirty seconds at 2200 rpm. The material was allowed to cool to 25° C., and then the silicone B side was added and mixed for another 15 seconds at 2200 rpm.

FIGS. 5-12 graphically depict thermal conductivity and electromagnetic radiation absorption of the above-described example interface pads blended at various platelet/sphere volumetric loading ratios and particle size ratios, as well as total particle filler loading concentrations. The graphical representations of the experimental data demonstrate the desired performance properties within specific attribute ranges, namely a total particulate filler loading concentration of 30-50% by volume in the polymer matrix, a volumetric loading ratio of platelet particles to spherical particles between 0.1:1 and 1:1, and a particle diameter ratio of the platelet particle diameter to the spherical particle diameter between 1:1 and 20:1.

Figure 5:
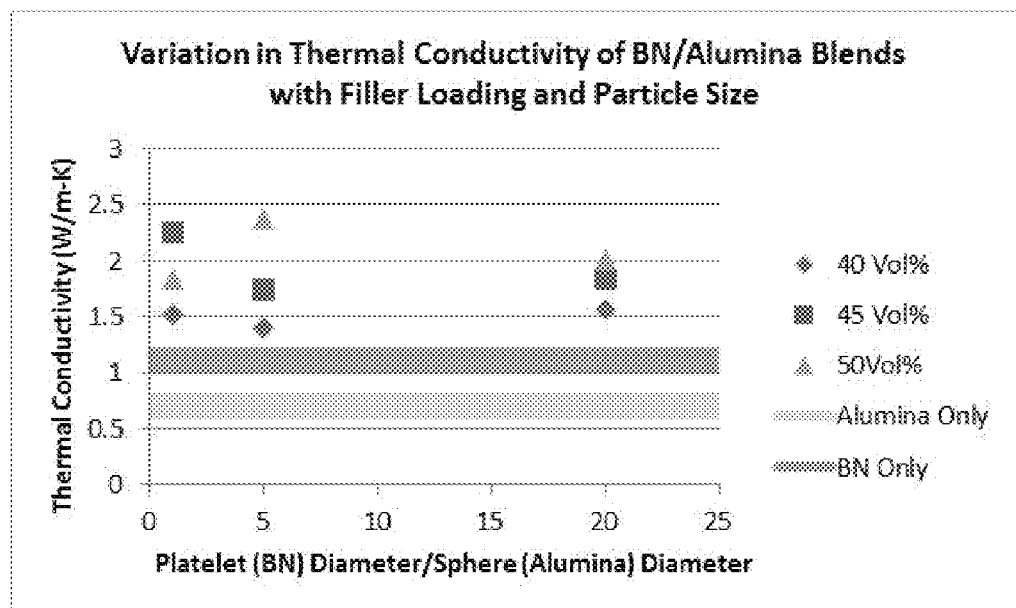
FIG. 5 is a chart depicting the variation in thermal conductivity of various boron nitride/alumina particle blends with total particle filler loading concentrations and relative particle diameter ratios.

FIG. 5 depicts the variation in thermal conductivity of various boron nitride/alumina particle blends with total particle filler loading concentrations and relative particle size ratios. The chart clearly shows that the particulate filler dispersion containing both spherical and platelet particles significantly outperforms particulate filler dispersions with solely spherical or platelet particles, at equivalent total loading concentrations. This demonstrates a "non-additive" effect, wherein the performance of a combination of spherical and platelet particles far exceeds the expected performance at that loading concentration.

Figure 6:
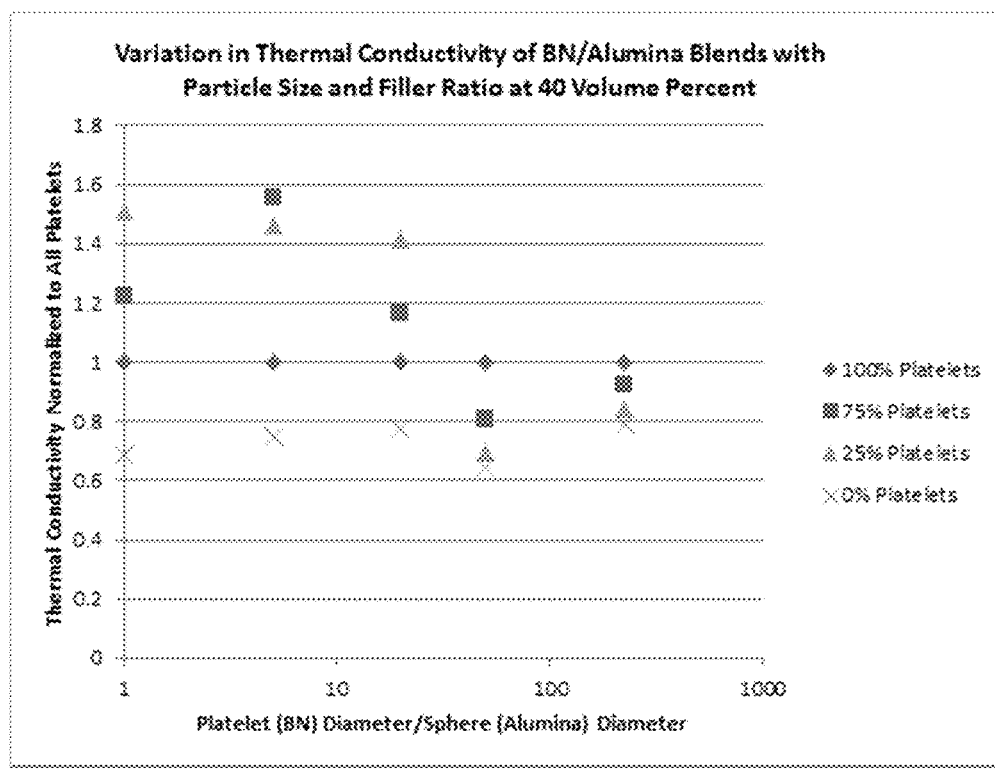
FIG. 6 is a chart depicting the variation in thermal conductivity of boron nitride/alumina particle blends with relative particle diameter ratios and relative volumetric loading ratios.

FIG. 6 demonstrates the variation in thermal conductivity of boron nitride/alumina particle dispersion blends with relative particle diameter ratios and relative volumetric loading ratios. It can be seen from FIG. 6 that the surprising non-additive benefit of the present dispersions diminishes significantly beyond a platelet:sphere particle diameter ratio of 20:1.

Figure 7:
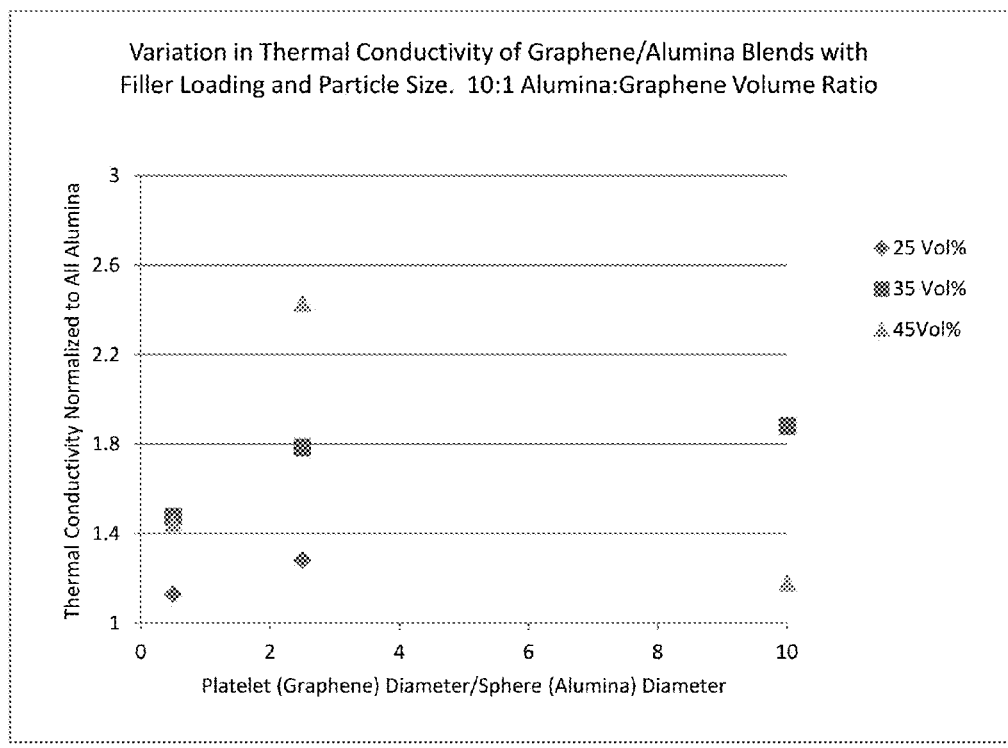
FIG. 7 is a chart depicting the variation in thermal conductivity of graphene/alumina particle blends with total particle filler loading concentrations and relative particle diameter ratios.
Figure 8:
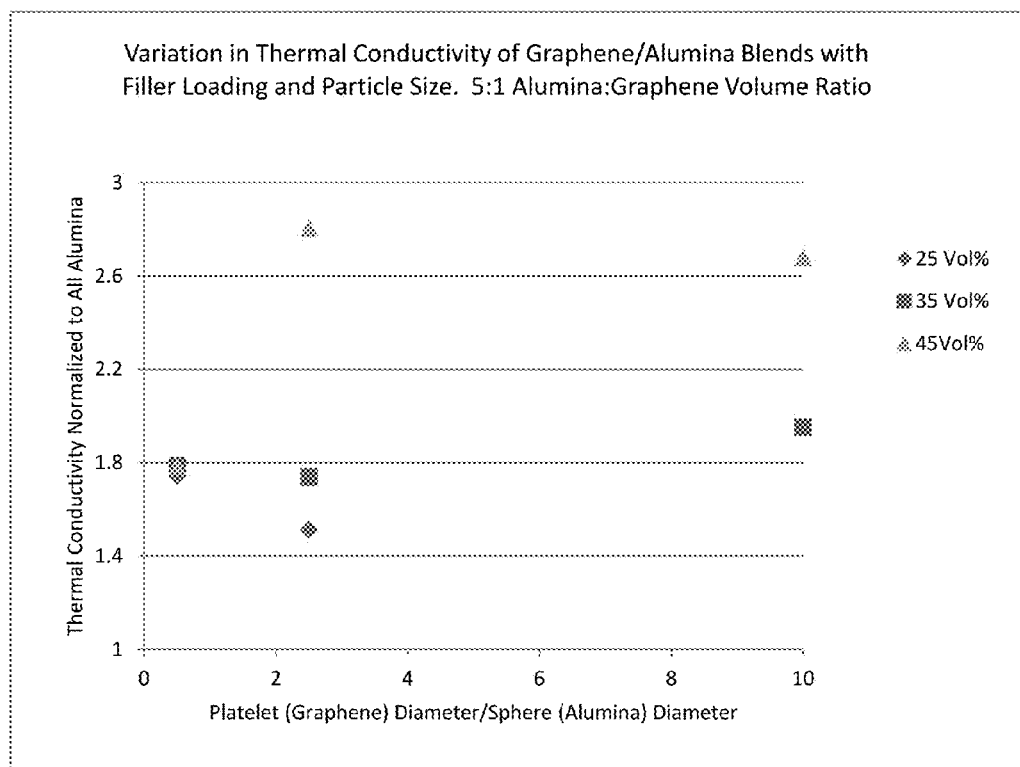
FIG. 8 is a chart depicting the variation in thermal conductivity of graphene/alumina particle blends with total particle filler loading concentrations and relative particle diameter ratios.

FIG. 7 exhibits the variation in thermal conductivity of graphene/alumina blends with total particulate filler loading concentration and relative particle diameter ratios at a volumetric loading ratio of platelet particles to spherical particles of 0.1:1. Likewise, FIG. 8 shows the variation in thermal conductivity of graphene/alumina blends with total particle filler loading concentrations and relative particle diameter ratios at a volumetric loading ratio of platelet particles to spherical particles of 0.2:1.

Figure 9:
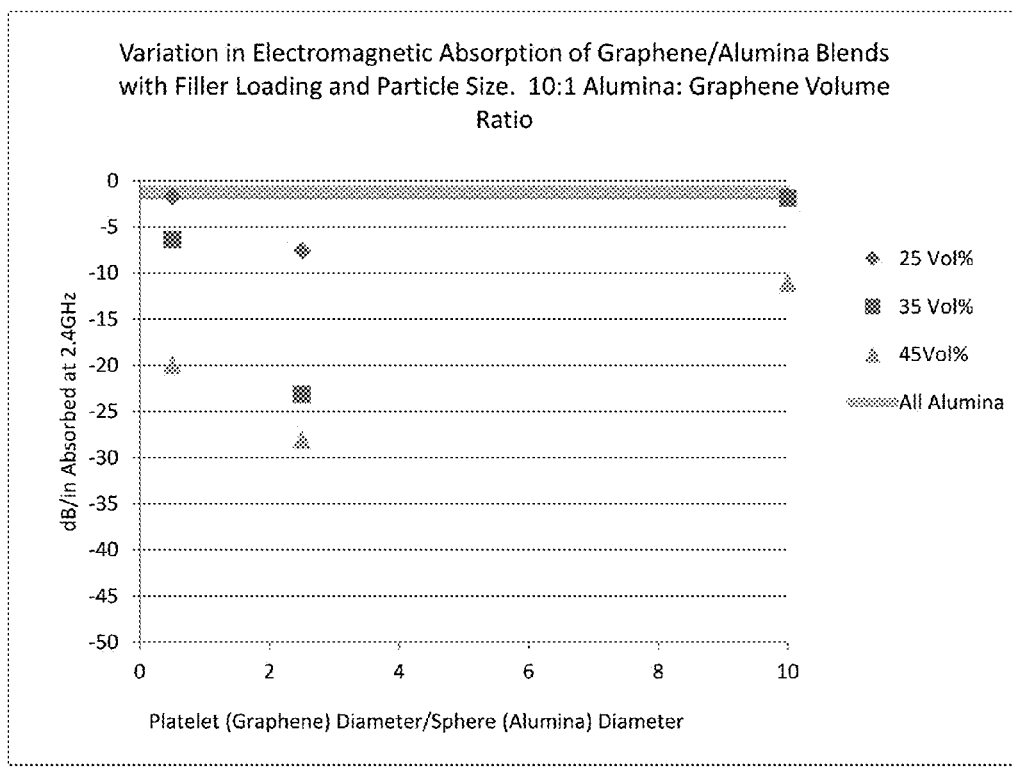
FIG. 9 is a chart depicting the variation in electromagnetic radiation absorption of graphene/alumina particle blends with total particle filler loading concentrations and relative particle diameter ratios.
Figure 10:
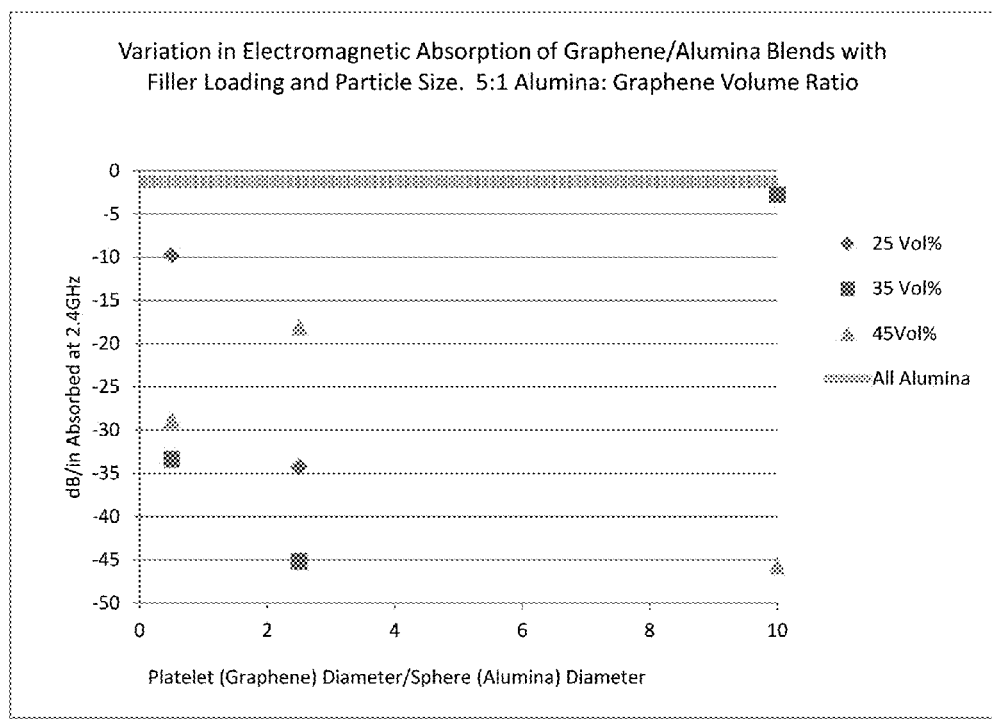
FIG. 10 is a chart depicting the variation in electromagnetic radiation absorption of graphene/alumina particle blends with total particle filler loading concentrations and relative particle diameter ratios.

FIG. 9 exhibits the variation in electromagnetic radiation absorption of graphene/alumina particle blends with total particle filler loading concentrations and relative particle diameter ratios at a volumetric loading ratio of platelet particles to spherical particles of 0.1:1. Similarly, FIG. 10 shows the variation in electromagnetic radiation absorption of graphene/alumina particle blends with total particulate filler loading concentration and relative particle diameter ratios at a volumetric loading ratio of platelet particles to spherical particles of 0.2:1. Each of FIGS. 7-10 demonstrate the non-additive benefits of the present dispersions within their respective attribute ranges.

Figure 11:
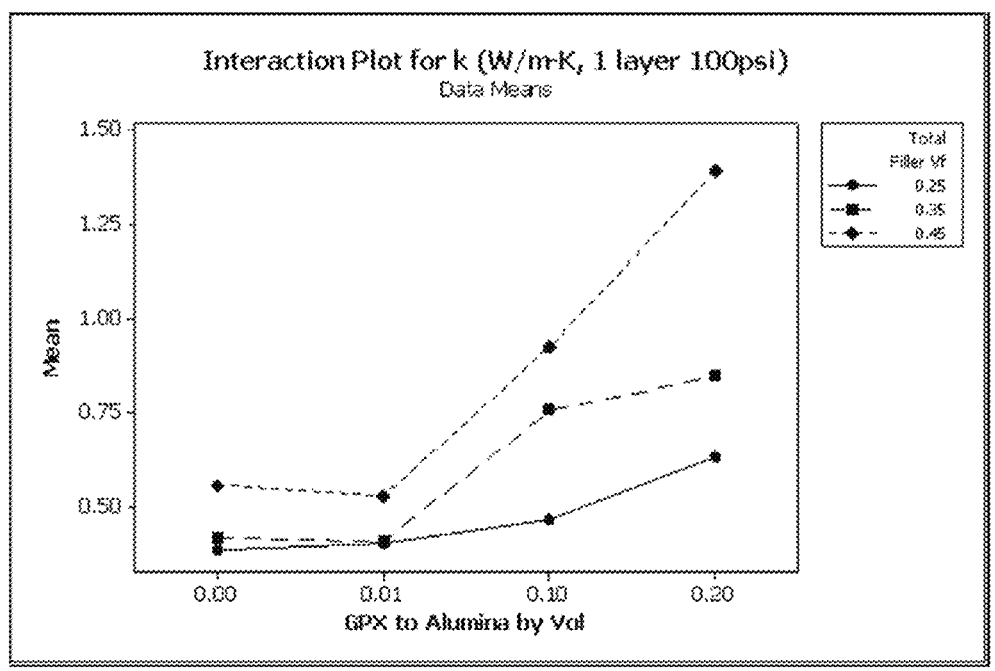
FIG. 11 is a chart depicting the variation in thermal conductivity of graphene/alumina particle blends with total particle filler loading concentrations and relative volumetric loading ratios.
Figure 12:
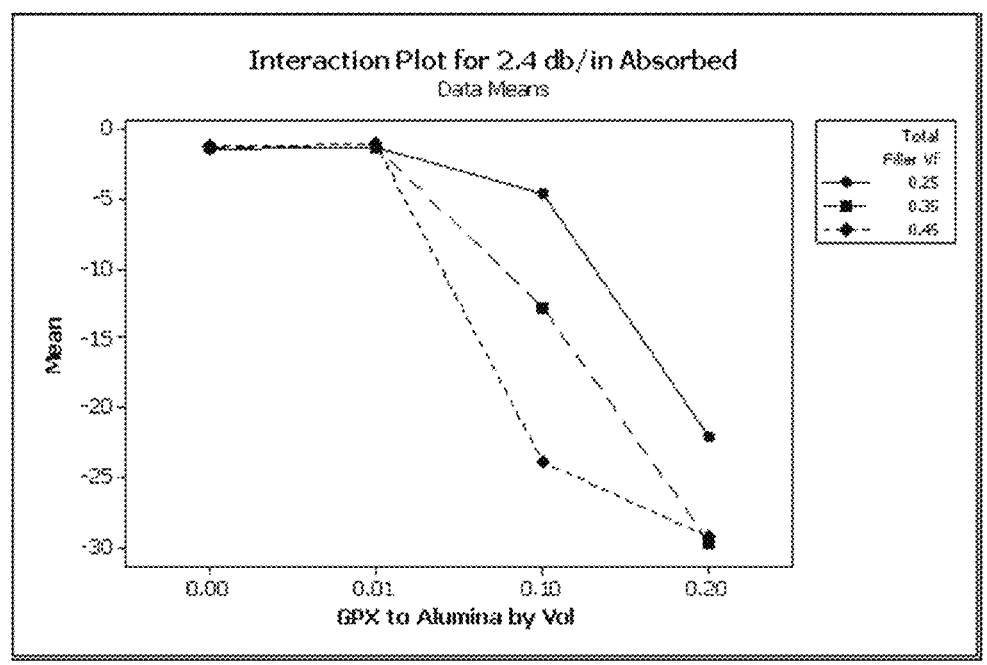
FIG. 12 is a chart depicting the variation in electromagnetic radiation absorption of graphene/alumina particle blends with total particle filler loading concentrations and relative volumetric loading ratios.

FIGS. 11 and 12 show thermal conductivity and electromagnetic radiation absorption data for graphene/alumina particle dispersion blends with total particle filler loading concentrations and relative volumetric loading ratios of the platelet particles to the spherical particles.

The invention has been described herein in considerable detail in order to comply with the patent statutes, and to provide those skilled in the art with the information needed to apply the novel principles and to construct and use embodiments of the invention as required. However, it is to be understood that various modifications can be accomplished without departing from the scope of the invention itself.

What is claimed is:

1. A thermal interface material positionable in proximity to a heat source for thermal dissipation from the heat source and for shielding of electromagnetic interference, said thermal interface material comprising:
    a polymer matrix; and
    thermally conductive particulate filler dispersed in said polymer matrix at 40-50% by volume, said particulate filler including substantially spherical alumina particles having an aspect ratio of between 0.8-1.2 and a spherical particle diameter, and platelet particles having a length, a width, and a thickness and a platelet particle diameter, wherein said length and said width are each greater than said thickness, said platelet particles having an aspect ratio of at least 10, a volumetric loading ratio of said platelet particles to said spherical alumina particles being between 0.1:1 and 0.2:1, and a particle diameter ratio of said platelet particle diameter to said spherical particle diameter being between 1:1 and 20:1, said platelet particles consist of boron nitride,
    wherein said thermal interface material exhibits a thermal conductivity of at least 0.5 W/m*K, and a compressive modulus of less than 5 MPa at 20° C.

2. A thermal interface material as in claim 1 which exhibits an electromagnetic radiation absorption of at least 10 dB/in at 2.4 GHz.

3. A thermal interface material as in claim 1 wherein said platelet particles have an aspect ratio of at least 100.

4. A thermal interface material as in claim 3 wherein said length and said width of said platelet particles are about equal.

5. A thermal interface material as in claim 1 wherein said polymer matrix is a thermoplastic elastomer.

6. An electronic package, comprising:
    an electronic component;
    a heat dissipation member; and
    the thermal interface material of claim 1 disposed between and in contact with said electronic component and said heat dissipation member.

7. A thermal interface material positionable in proximity to a heat source for thermal dissipation from the heat source and for shielding of electromagnetic interference, said thermal interface material comprising:
    a polymer matrix; and
    thermally conductive particulate filler dispersed in said polymer matrix at 25-45% by volume, said particulate filler including substantially spherical alumina particles having an aspect ratio between 0.8-1.2 and a spherical particle diameter, and platelet particles having a length, a width, and a thickness and a platelet particle diameter, wherein said length and said width are each greater than said thickness, said platelet particles having an aspect ratio of at least 10, a volumetric loading ratio of said platelet particles to said spherical alumina particles being between 0.1:1 and 0.2:1, and a particle diameter ratio of said platelet particle diameter to said spherical particle diameter being between 1:1 and 10:1, said platelet consists of graphene,
    wherein said thermal interface material exhibits a thermal conductivity of at least 0.5 W/m*K, and a compressive modulus of less than 5 MPa at 20° C.

8. A thermal interface material as in claim 7 which exhibits an electromagnetic radiation absorption of at least 10 dB/in at 2.4 GHz.

9. A thermal interface material as in claim 7 wherein said platelet particles have an aspect ratio of at least 100.

10. A thermal interface material as in claim 9 wherein said length and said width of said platelet particles are about equal.

11. A thermal interface material as in claim 7 wherein said polymer matrix is a thermoplastic elastomer.

12. A thermal interface material as in claim 7 wherein said thermally conductive filler is dispersed in said polymer matrix at 35-45% by volume.

13. An electronic package, comprising:
    an electronic component;
    a heat dissipation member; and
    the thermal interface material of claim 7 disposed between and in contact with said electronic component and said heat dissipation member.

* * * * *